(12) United States Patent
Ye

(10) Patent No.: US 12,457,851 B2
(45) Date of Patent: Oct. 28, 2025

(54) DISPLAY PANEL HAVING ANODE PORTION WITH IMPROVED SYMMETRY AND MOBILE TERMINAL

(71) Applicant: WUHAN CHINA STAR OPTOELECTRONICS SEMICONDUCTOR DISPLAY TECHNOLOGY CO., LTD., Hubei (CN)

(72) Inventor: Jian Ye, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 592 days.

(21) Appl. No.: 17/614,525

(22) PCT Filed: Oct. 26, 2021

(86) PCT No.: PCT/CN2021/126466
§ 371 (c)(1),
(2) Date: Nov. 28, 2021

(87) PCT Pub. No.: WO2023/060645
PCT Pub. Date: Apr. 20, 2023

(65) Prior Publication Data
US 2023/0115668 A1    Apr. 13, 2023

(30) Foreign Application Priority Data
Oct. 12, 2021 (CN) .......................... 202111188802.6

(51) Int. Cl.
*H10K 59/124* (2023.01)
*H10K 59/121* (2023.01)
(Continued)

(52) U.S. Cl.
CPC ......... *H10K 59/121* (2023.02); *H10K 59/124* (2023.02); *H10K 59/131* (2023.02); *H10K 59/353* (2023.02); *H10K 59/80515* (2023.02)

(58) Field of Classification Search
CPC .. H10K 59/121; H10K 59/124; H10K 59/131; H10K 59/353; H10K 59/80515
See application file for complete search history.

(56) References Cited

U.S. PATENT DOCUMENTS

2015/0187270 A1*  7/2015  Lee ...................... G09G 3/3266
                                                  345/76
2016/0148986 A1*  5/2016  Lee ...................... G09G 3/3233
                                                  345/694
(Continued)

FOREIGN PATENT DOCUMENTS

CN      107452778 A    12/2017
CN      107507573 A    12/2017
(Continued)

*Primary Examiner* — Adam J Snyder
(74) *Attorney, Agent, or Firm* — Rivka Friedman

(57) ABSTRACT

A display panel and a mobile terminal each includes a substrate, an anode portion disposed on the substrate, and a first circuit portion and a second circuit portion disposed between the anode portion and the substrate. The first circuit portion is disposed close to a first edge of the anode portion, the second circuit portion is disposed close to a second edge of the anode portion, and both are disposed on opposite sides of a center of the anode portion. A distance between the first circuit portion and the first edge is a first distance, a distance between the second circuit portion and the second edge is a second distance, and an absolute value of a difference between the two is less than a width of the first circuit portion or a width of the second circuit portion.

16 Claims, 3 Drawing Sheets

(51) Int. Cl.
*H10K 59/131* (2023.01)
*H10K 59/35* (2023.01)
*H10K 59/80* (2023.01)

(56) References Cited

U.S. PATENT DOCUMENTS

2016/0260792 A1\* 9/2016 Kim ........................ H10K 59/35
2018/0076270 A1\* 3/2018 Kwon ................... H10K 59/353
2018/0342570 A1\* 11/2018 Hong ................. H10K 59/1216
2019/0064552 A1\* 2/2019 Kim ................... H10K 59/1315
2021/0313410 A1\* 10/2021 Kim ..................... H10K 59/131

FOREIGN PATENT DOCUMENTS

| | | |
|---|---|---|
| CN | 107978622 A | 5/2018 |
| CN | 109427854 A | 3/2019 |
| CN | 110061042 A | 7/2019 |
| CN | 110610980 A | 12/2019 |
| CN | 111508978 A | 8/2020 |
| CN | 111785742 A | 10/2020 |
| CN | 113078196 A | 7/2021 |
| EP | 2365529 A2 | 9/2011 |
| JP | 2020024373 A | 2/2020 |
| WO | 2021016947 A1 | 2/2021 |

\* cited by examiner

DISPLAY PANEL HAVING ANODE PORTION WITH IMPROVED SYMMETRY AND MOBILE TERMINAL

FIELD OF INVENTION

The present disclosure relates to the technical field of display, particularly to manufacture of display devices, and more particularly to a display panel and a mobile terminal.

BACKGROUND

An active matrix organic light-emitting diode (AMOLED) display panel independently controls light emission of each pixel through a transistor array, and has advantages of high brightness, high resolution, high efficiency, and easy realization of large-area display.

Currently, under an anode layer of the AMOLED display panel, there are metal wires located at different layers and asymmetric with respect to a center of the anode layer. Therefore, a surface of the anode layer comprises asymmetrically distributed convex structures, which causes a light-emitting angle of a light emitted by a light-emitting device located above the anode layer to shift, so that a brightness or chromaticity viewing angle of the AMOLED display panel is asymmetric, thereby reducing display quality.

Therefore, the brightness or chromaticity viewing angle of the current AMOLED display panel has defects and needs to be improved.

SUMMARY OF DISCLOSURE

A purpose of the present disclosure is to provide a display panel and a mobile terminal, so as to solve a technical problem of low display quality caused by defects in a brightness or chromaticity viewing angle of an current AMOLED display panel.

The present disclosure provides a display panel comprising a substrate, an anode portion disposed on the substrate, and a first circuit and a second circuit disposed between the anode portion and the substrate. The first circuit is disposed close to a first edge of the anode portion. The second circuit is disposed close to a second edge of the anode portion. The first circuit comprises a first circuit portion disposed corresponding to the anode portion. The second circuit comprises a second circuit portion disposed corresponding to the anode portion. The first circuit portion and the second circuit portion are disposed on opposite sides of a center of the anode portion. A distance between the first circuit portion and the first edge is a first distance. A distance between the second circuit portion and the second edge is a second distance. An absolute value of a difference between the first distance and the second distance is less than a width of the first circuit portion or a width of the second circuit portion. A distance between the first circuit portion and the center of the anode portion is a third distance. A distance between the second circuit portion and the center of the anode portion is a fourth distance. An absolute value of a difference between the third distance and the fourth distance is less than the width of the first circuit portion or the width of the second circuit portion. The first circuit further comprises a third circuit portion protruding beyond the anode portion. The width of the first circuit portion and the width of the second circuit portion are less than a width of the third circuit portion.

In an embodiment, an absolute value of a difference between the width of the first circuit portion and the width of the second circuit portion is less than an absolute value of a difference between the width of the third circuit portion and the width of the second circuit portion.

In an embodiment, the first circuit portion and the second circuit portion are disposed axisymmetrically with respect to a centerline, the centerline passes through the center of the anode portion. The anode portion is axisymmetric. The centerline is an axis of symmetry of the anode portion.

In an embodiment, the display panel further comprises a pixel circuit that comprises a driving transistor and a light-emitting device electrically connected to the driving transistor. The first circuit transmits a working voltage to the light-emitting device. The second circuit transmits a data voltage to the driving transistor.

In an embodiment, the first circuit portion comprises a first sub-circuit portion located at a first circuit layer and a second sub-circuit portion located at a second circuit layer. The second circuit portion is located at the first circuit layer or the second circuit layer. The first sub-circuit portion is electrically connected to the second sub-circuit portion. An absolute value of a difference between a width of the first sub-circuit portion and a width of the second sub-circuit portion is less than an absolute value of a difference between the width of the first circuit portion and the width of the second circuit portion.

In an embodiment, the driving transistor comprises an active portion, a first gate portion located above the active portion, a second gate portion located above the first gate portion, and a source and drain portion located above the second gate portion and at the first circuit layer.

In an embodiment, the second circuit layer is disposed between the first circuit layer and the anode portion, and the second circuit is located at the second circuit layer.

In an embodiment, the third circuit portion comprises a third sub-circuit portion located at a third circuit layer and a fourth sub-circuit portion located at a fourth circuit layer. The third sub-circuit portion is electrically connected to the fourth sub-circuit portion. The first circuit portion and the second circuit are both located at the third circuit layer or the fourth circuit layer.

The present disclosure further provides a display panel comprising a substrate, an anode portion disposed on the substrate, and a first circuit and a second circuit disposed between the anode portion and the substrate. The first circuit is disposed close to a first edge of the anode portion. The second circuit is disposed close to a second edge of the anode portion. The first circuit comprises a first circuit portion disposed corresponding to the anode portion. The second circuit comprises a second circuit portion disposed corresponding to the anode portion. The first circuit portion and the second circuit portion are disposed on opposite sides of a center of the anode portion. A distance between the first circuit portion and the first edge is a first distance. A distance between the second circuit portion and the second edge is a second distance. An absolute value of a difference between the first distance and the second distance is less than a width of the first circuit portion or a width of the second circuit portion.

In an embodiment, the first circuit further comprises a third circuit portion protruding beyond the anode portion, and the width of the first circuit portion and the width of the second circuit portion are less than a width of the third circuit portion.

In an embodiment, an absolute value of a difference between the width of the first circuit portion and the width of the second circuit portion is less than an absolute value of a difference between the width of the third circuit portion and the width of the second circuit portion.

In an embodiment, a distance between the first circuit portion and the center of the anode portion is a third distance, a distance between the second circuit portion and the center of the anode portion is a fourth distance, and an absolute value of a difference between the third distance and the fourth distance is less than the width of the first circuit portion or the width of the second circuit portion.

In an embodiment, the first circuit portion and the second circuit portion are disposed axisymmetrically with respect to a centerline, the centerline passes through the center of the anode portion. The anode portion is axisymmetric. The centerline is an axis of symmetry of the anode portion.

In an embodiment, the display panel further comprises a pixel circuit that comprises a driving transistor and a light-emitting device electrically connected to the driving transistor. The first circuit transmits a working voltage to the light-emitting device. The second circuit transmits a data voltage to the driving transistor.

In an embodiment, the first circuit portion comprises a first sub-circuit portion located at a first circuit layer and a second sub-circuit portion located at a second circuit layer. The second circuit portion is located at the first circuit layer or the second circuit layer. The first sub-circuit portion is electrically connected to the second sub-circuit portion. An absolute value of a difference between a width of the first sub-circuit portion and a width of the second sub-circuit portion is less than an absolute value of a difference between the width of the first circuit portion and the width of the second circuit portion.

In an embodiment, the driving transistor comprises an active portion, a first gate portion located above the active portion, a second gate portion located above the first gate portion, and a source and drain portion located above the second gate portion and at the first circuit layer.

In an embodiment, the display panel further comprises a first planarization layer disposed between the second circuit layer and the first circuit layer. The source and drain portion comprises a source electrode and a drain electrode disposed at a same layer. The second circuit layer comprises a node portion corresponding to the drain electrode. The node portion is electrically connected to the drain electrode through a via hole passing through the first planarization layer. The first sub-circuit portion located at the first circuit layer and the second sub-circuit portion located at the second circuit layer are electrically connected to each other through another via hole passing through the first planarization layer.

In an embodiment, the second circuit layer is disposed between the first circuit layer and the anode portion, and the second circuit is located at the second circuit layer.

In an embodiment, the third circuit portion comprises a third sub-circuit portion located at a third circuit layer and a fourth sub-circuit portion located at a fourth circuit layer. The third sub-circuit portion is electrically connected to the fourth sub-circuit portion. The first circuit portion and the second circuit are both located at the third circuit layer or the fourth circuit layer.

The present disclosure further provides a mobile terminal comprising a terminal body and any display panel as described above. The terminal body is integrated with the display panel.

The present disclosure provides a display panel and a mobile terminal. The display panel comprises a substrate, an anode portion disposed on the substrate, and a first circuit and a second circuit disposed between the anode portion and the substrate. The first circuit is disposed close to a first edge of the anode portion. The second circuit is disposed close to a second edge of the anode portion. The first circuit comprises a first circuit portion disposed corresponding to the anode portion. The second circuit comprises a second circuit portion disposed corresponding to the anode portion. The first circuit portion and the second circuit portion are disposed on opposite sides of a center of the anode portion. A distance between the first circuit portion and the first edge is a first distance. A distance between the second circuit portion and the second edge is a second distance. An absolute value of a difference between the first distance and the second distance is less than a width of the first circuit portion or a width of the second circuit portion. In the present disclosure, the difference between the first distance and the second distance is set to be sufficiently small. That is, a distance between a convex structure of the anode portion caused by the first circuit and one corresponding edge is equivalent to distance between another convex structure of the anode portion caused by the second circuit and one corresponding edge, which improves symmetry of the two convex structures of the anode portion, thereby reducing deviation of a light-emitting angle of a light emitted by a light-emitting device. Therefore, a degree of asymmetry of a brightness or chromaticity viewing angle of the display panel is reduced, thereby improving display quality.

BRIEF DESCRIPTION OF DRAWINGS

The present disclosure will be further described in detail below in combination with accompany drawings. It should be noted that the accompanying drawings in the following description are only used to illustrate some embodiments of the present disclosure. For those skilled in the art, other drawings may be obtained from these accompanying drawings without creative labor.

DETAILED DESCRIPTION

Figure 1:
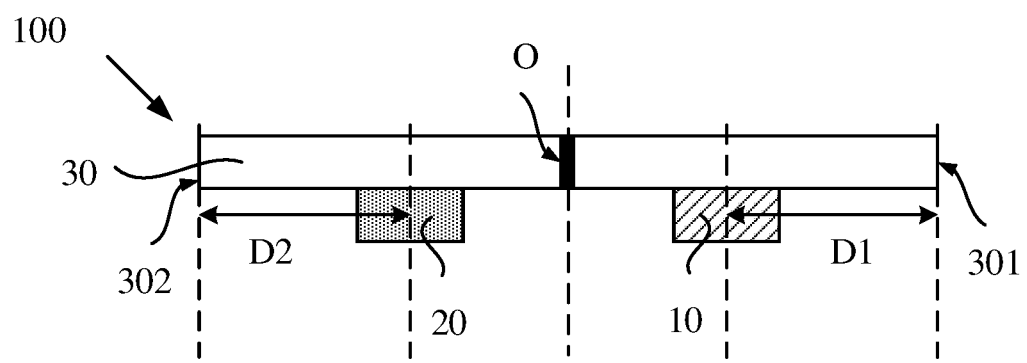
FIG. 1 is a schematic cross-sectional view of a first type of a display panel according to an embodiment of the present disclosure.

Technical solutions in embodiments of the present disclosure will be clearly and completely described below in conjunction with accompanying drawings in the embodiments of the present disclosure. It is apparent that the described embodiments are merely a part of the embodiments of the present disclosure and not all embodiments. All other embodiments obtained by those skilled in the art based on the embodiments of the present disclosure without creative labor are within claimed scope of the present disclosure.

In a description of the present disclosure, it should be understood that location or position relationships indicated by terms, such as "away from", "close to", and "between", are location or position relationships based on illustration of the accompanying drawings. For example, "close to" refers to a side of opposite sides of an object in the accompanying drawings that is closer to another object. "Between" refers to any position sandwiched between two objects in the accompanying drawings. The above location or position relationships are merely used for describing the present disclosure and simplifying the description instead of indicating or implying the indicated apparatuses or elements should have specified locations or be constructed and operated according to specified locations, and should not be intercepted as limitations to the present disclosure.

Furthermore, it should be further noted that the accompanying drawings only illustrate structures that are closely related to the present disclosure, while omitting details not closely related to the present disclosure. The purpose is to simplify the accompanying drawings so that features are clear at a glance. An actual device is not exactly same as a device shown in the accompanying drawings, and the accompanying drawings are not a limitation of the actual device.

The present disclosure provides a display panel which comprises, but is not limited to, the following embodiments and a combination thereof.

In an embodiment, as shown in FIG. 1 to FIG. 4, a display panel 100 comprising a substrate 807, an anode portion 30 disposed on the substrate 807, and a first circuit 10 and a second circuit 20 disposed between the anode portion 30 and the substrate 807. The first circuit 10 is disposed close to a first edge 301 of the anode portion 30. The second circuit 20 is disposed close to a second edge 302 of the anode portion 30. The first circuit 10 comprises a first circuit portion 101 disposed corresponding to the anode portion 30. The second circuit 20 comprises a second circuit portion 201 disposed corresponding to the anode portion 30. The first circuit portion 101 and the second circuit portion 201 are disposed on opposite sides of a center O of the anode portion 30. A distance between the first circuit portion 101 and the first edge 301 is a first distance D1. A distance between the second circuit portion 201 and the second edge 302 is a second distance D2. An absolute value of a difference between the first distance D1 and the second distance D2 is less than a width of the first circuit portion 101 or a width of the second circuit portion 201.

Figure 4:
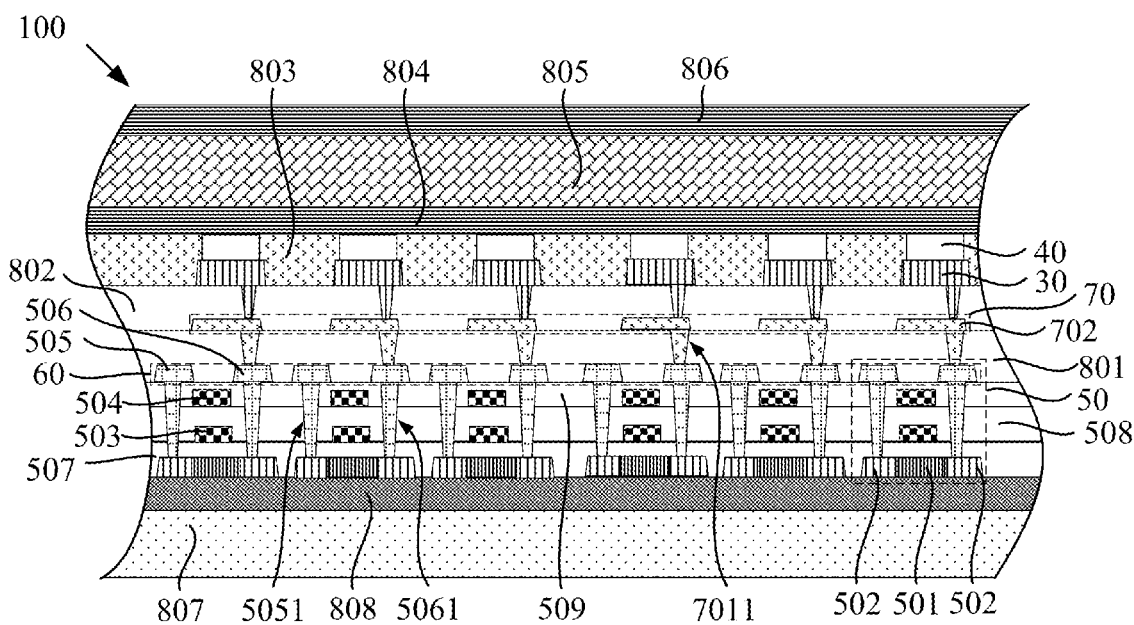
FIG. 4 is a schematic cross-sectional view of the second type of the display panel according to an embodiment of the present disclosure.

Specifically, as shown in FIG. 4, the display panel 100 comprises an anode layer comprising a plurality of anode portions 30 and a light-emitting layer disposed on the anode layer. The light-emitting layer comprises a plurality of light-emitting portions 40 corresponding to the anode portions 30 in a one-to-one manner. Each of the anode portions 30 is electrically connected to one corresponding light-emitting portion 40 to control light emission of the corresponding light-emitting portion 40. Furthermore, the display panel 100 further comprises a buffer layer 808, a transistor layer, and a cathode layer. The buffer layer 808 is disposed between the transistor layer and the substrate 807. The transistor layer is disposed on a side of the anode layer away from the light-emitting layer. The cathode layer is disposed on a side of the light-emitting layer away from the anode layer. The transistor layer comprises a plurality of transistors 50 corresponding to the anode portions 30 in a one-to-one manner. Each of the transistors 50 is electrically connected to one corresponding anode portion 30 to control a voltage of the corresponding anode portion 30. Each of the light-emitting portions 40 emits light through a current generated by a voltage difference between the corresponding anode portion 30 and the cathode layer. Moreover, some of the light-emitting portions 40 emitting light of different colors may form a light-emitting unit. For example, each light-emitting unit may comprise, but is not limited to, a light-emitting portion 40 that emits red light, a light-emitting portion 40 that emits green light, and a light-emitting portion 40 that emits blue light.

Figure 2:
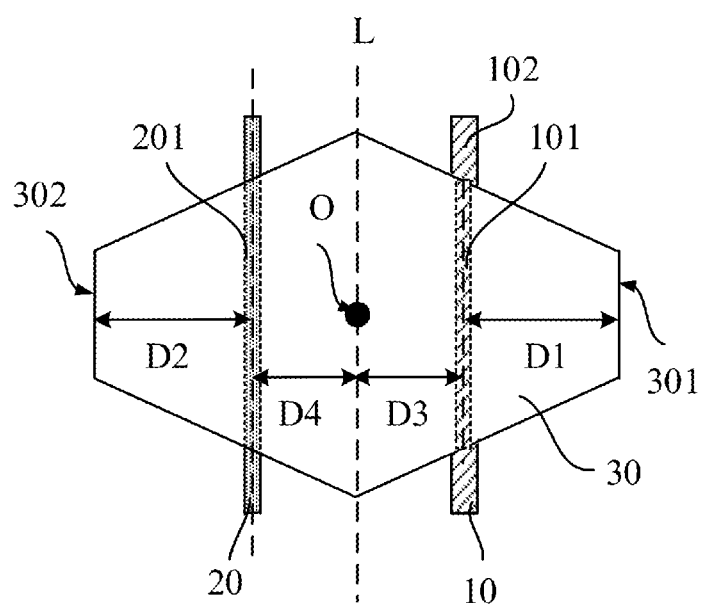
FIG. 2 is a schematic top view of the first type of the display panel according to an embodiment of the present disclosure.
Figure 3:
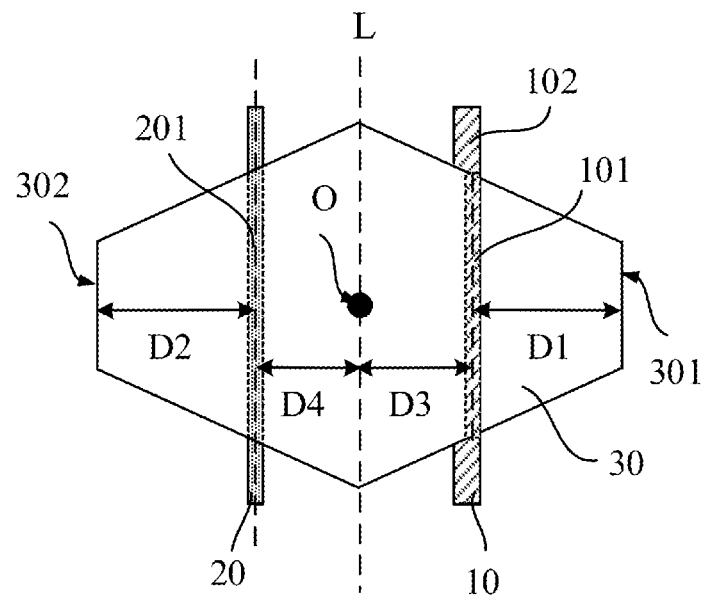
FIG. 3 is a schematic top view of a second type of a display panel according to an embodiment of the present disclosure.

It should be noted that, as shown in FIG. 1 to FIG. 3, a plurality of circuits are disposed in different layers between the anode layer and the substrate 807. When the circuits disposed in different layers between each of the anode portions 30 and the substrate 807 have poor symmetry with respect to the anode portions 30, convex structures of the anode portions 30 caused by the circuits also have poor symmetry, which causes a light-emitting angle of the corresponding light-emitting portions 40 to shift, resulting in an asymmetrical brightness or chromaticity viewing angle of a displayed image.

Specifically, as shown in FIG. 1 to FIG. 3, this embodiment is described by taking an example in which the first circuit 10 and the second circuit 20 are disposed on the opposite sides of the center O of the anode portion 30 and a side of the anode portion 30 away from the corresponding light-emitting portion 40. It should be noted that the anode portion 30 is not limited to be symmetric herein. When the anode portion 30 is symmetric, the center O of the anode portion 30 can be understood as a midpoint between a midpoint of the first circuit portion 101 in a length direction of the first circuit portion 101 and a midpoint of the second circuit portion 201 in a length direction of the second circuit portion 201. The first edge 301 can be understood as a side of the anode portion 30 that is close to a side of the first circuit 10 away from the center O of the anode portion 30. The second edge 302 can be understood as a side of the anode portion 30 that is close to a side of the second circuit 20 away from the center O of the anode portion 30. Sizes and shapes of the first edge 301, the second edge 302, the first circuit portion 101, and the second circuit portion 201 are not limited herein. It can be understood that in this embodiment, the absolute value of the difference between the first distance D1 and the second distance D2 is less than the width of the first circuit portion 101 or the width of the second circuit portion 201. The width of the first circuit portion 101 and the width of the second circuit portion 201 are relatively small, for example, may be less than the first distance D1, the second distance D2, and a distance between the first circuit portion 101 and the second circuit portion 201. It can be understood herein that the difference between the first distance D1 and the second distance D2 is set to be sufficiently small. Moreover, the first distance D1 and the second distance D2 may be equal to each other. Therefore, this embodiment improves symmetry of the first circuit portion 101 and the second circuit portion 201 with respect to the center O of the anode portion 30, which reduces deviation of a light-emitting angle of the corresponding light-emitting portion 40, and reduces asymmetry of a brightness or chromaticity viewing angle of the displayed image.

Specifically, the first circuit portion 101 may be divided into a plurality of dividing points arranged at equal intervals in the length direction of the first circuit portion 101. At each of the dividing points, a vertical line perpendicular to a part of the first circuit portion 101 near the dividing point is drawn. A length of a part of each vertical line between the first circuit portion 101 and the first edge 301 may be used as a distance between one corresponding dividing point and the first edge 301. The first distance D1 can be understood as an average value of distances between the first edge 301 and the dividing points of the first circuit portion 101 in the length direction of the first circuit portion 101. A line formed by connecting the dividing points may bisect the first circuit portion 101 in the length direction of the first circuit portion 101. Similarly, the second distance D2 can be understood with reference to the above description. It should be noted that the first circuit portion 101 and the second circuit portion 201 are located on the opposite sides of the center O of the anode portion 30, but are not limited to the first circuit portion 101 and the second circuit portion 201 being parallel. For example, the first circuit portion 101 and the second circuit portion 201 may intersect, or extension lines of the first circuit portion 101 and the second circuit portion 201 may intersect. Furthermore, when circuits between the anode portion 30 and the substrate 807 have three or more projections on the anode portion 30, if a number of the projections is even, every two projections may be considered as a set of projections. Two projections in each set of projections may satisfy a relationship between the first circuit portion 101 and the second circuit portion 201, or may be symmetric with respect to the center O of the anode portion 30. If the number of the projections is odd, every two projections may be considered as a set of projections. Two projections in each set of projections may satisfy a relationship between the first circuit portion 101 and the second circuit portion 201, or may be symmetric with respect to the center O of the anode portion 30. An extra one projection may be symmetric with respect to the center O of the anode portion 30.

In an embodiment, as shown in FIG. 2 and FIG. 3, the first circuit 10 further comprises a third circuit portion 102 protruding beyond the anode portion 30, and the width of the first circuit portion 101 and the width of the second circuit portion 201 are less than a width of the third circuit portion 102. Please refer to the above description, it can be seen that in this embodiment, on the basis that the difference between the first distance D1 and the second distance D2 is set to be sufficiently small, the width of the first circuit portion 101 and the width of the second circuit portion 201 are set to be less than a width of a part of the first circuit 10 protruding beyond the anode portion 30. It should be noted that a number of layers of different parts of the first circuit 10 and the second circuit 20 in a top view is not limited herein, as long as the width of the first circuit portion 101 and the width of the third circuit portion 102 meet the above requirements in the top view. It can be understood that, in this embodiment, under a premise that a width of at least a part of the second circuit 20 corresponding to the anode portion 30 is less than the width of the part of the first circuit 10 protruding beyond the anode portion 30, the width of the first circuit portion 101 (i.e. a part of the first circuit 10 corresponding to the anode portion 30) is also set to be less than the width of the third circuit portion 102 (i.e. the part of the first circuit 10 protruding beyond the anode portion 30). Widths of the different parts of the first circuit 10 are set to be different, so that the width of the first circuit portion 101 and the width of the second circuit portion 201 are both set to be smaller. This also improves the symmetry of the first circuit portion 101 and the second circuit portion 201 with respect to the center O of the anode portion 30, thereby reducing the deviation of the light-emitting angle of the corresponding light-emitting portion 40, and reduces the asymmetry of the brightness or chromaticity viewing angle of the displayed image.

In an embodiment, as shown in FIG. 2, an absolute value of a difference between the width of the first circuit portion 101 and the width of the second circuit portion 201 is less than an absolute value of a difference between the width of the third circuit portion 102 and the width of the second circuit portion 201. It should be noted that regarding the aforementioned parameters such as the first distance D1 and the second distance D2, the first circuit portion 101 is regarded as a line formed by connecting corresponding dividing points, and the second circuit portion 201 is regarded as a line formed by connecting corresponding dividing points. That is, the difference between the width of the first circuit portion 101 and the width of the second circuit portion 201 is not considered. When the width of the first circuit portion 101 and the width of the second circuit portion 201 are greatly different, even if both the first distance D1 and the second distance D2 meet the above requirements, a distance between the first edge 301 and a side of the first circuit portion 101 close to the first edge 301 and a distance between the second edge 302 and a side of the second circuit portion 201 close to the second edge 302 still have a large difference. This causes a certain deviation of the light-emitting angle of the corresponding light-emitting portion 40.

It can be understood that in this embodiment, the difference between the width of the first circuit portion 101 and the width of the second circuit portion 201 is set to be rather small. Herein, only the absolute value of the difference between the width of the third circuit portion 102 and the width of the second circuit portion 201 is used as a reference for description, which can eliminate an influence of the difference between the width of the first circuit portion 101 and the width of the second circuit portion 201 on the parameters such as the first distance D1 and the second distance D2. Furthermore, the width of the first circuit portion 101 may be equal to the width of the second circuit portion 201.

In an embodiment, as shown in FIG. 1 to FIG. 3, a distance between the first circuit portion 101 and the center O of the anode portion 30 is a third distance D3, and a distance between the second circuit portion 201 and the center O of the anode portion 30 is a fourth distance D4. An absolute value of a difference between the third distance D3 and the fourth distance D4 is less than the width of the first circuit portion 101 or the width of the second circuit portion 201. It should be noted that, on the basis that the absolute value of the difference between the first distance D1 and the second distance D2 is less than the width of the first circuit portion 101 or the width of the second circuit portion 201, the first circuit portion 101 and the second circuit portion 201 have various distributions. For example, after the first circuit portion 101 is determined, there may be a plurality of circuits corresponding to a plurality of projections meeting the above requirements on another side of the center O of the anode portion 30, which may be used as the second circuit portion 201. When the first distance D1 and the second distance D2 are equal, the deviation of the light-emitting angle of the corresponding light-emitting portion 40 can be greatly improved.

It can be understood that after the first circuit portion 101 is determined, a degree of the difference between the third distance D3 and the fourth distance D4 is further limited in this embodiment. Herein, only the width of the first circuit portion 101 or the width of the second circuit portion 201 is used as a reference for description. In a plurality of projections that meet the above requirement "the absolute value of the difference between the first distance D1 and the second distance D2 is less than the width of the first circuit portion 101 or the width of the second circuit portion 201", a plurality of circuits corresponding to a plurality of projections whose distance from the center O of the anode portion 30 is close to the third distance D3 are selected as the second line portion 201, which makes a difference between the two sufficiently small. That is, this embodiment further makes the difference between the third distance D3 and the fourth distance D4 smaller, which further improves the symmetry of the first circuit portion 101 and the second circuit portion 201 with respect to the center O of the anode portion 30, thereby reducing the deviation of the light-emitting angle of the corresponding light-emitting portion 40, and reducing the asymmetry of the brightness or chromaticity viewing angle of the displayed image.

In an embodiment, as shown in FIG. 2 and FIG. 3, the first circuit portion 101 and the second circuit portion 201 are disposed axisymmetrically with respect to a centerline L. The centerline L passes through the center O of the anode portion 30. The anode portion 30 is axisymmetric. The centerline L is an axis of symmetry of the anode portion 30. Specifically, in this embodiment, the first circuit portion 101 and the second circuit portion 201 are disposed to be axisymmetric. The first circuit portion 101 and the second circuit portion 201 are symmetric with respect to the centerline L. That is, a shape of the first circuit portion 101 and a shape of the second circuit portion 201 are same, and a distance between any point on the first circuit portion 101 and the centerline L is equal to a distance between one corresponding point on the second circuit portion 201 and the centerline L. It can be understood that on the basis that the absolute value of the difference between the first distance D1 and the second distance D2 is less than the width of the first circuit portion 101 or the width of the second circuit portion 201, in this embodiment, the centerline L passes through the center O of the anode portion 30, which further improves the symmetry of the first circuit portion 101 and the second circuit portion 201 with respect to the center O of the anode portion 30, thereby reducing the deviation of the light-emitting angle of the corresponding light-emitting portion 40, and reducing the asymmetry of the brightness or chromaticity viewing angle of the displayed image. Furthermore, this embodiment further limits a shape of the anode portion 30. That is, the anode portion 30 is axisymmetric. Moreover, the first circuit portion 101 and the second circuit portion 201 are disposed axisymmetrically with respect to the anode portion 30, which further improves overall symmetry of the anode portion 30, the first circuit portion 101, and the second circuit portion 201, thereby further reducing the deviation of the light-emitting angle of the corresponding light-emitting portion 40, and reducing the asymmetry of the brightness or chromaticity viewing angle of the displayed image.

In an embodiment, as shown in FIG. 2 to FIG. 5, the display panel 100 further comprises a pixel circuit. The pixel circuit comprises a plurality of driving transistors and a plurality of light-emitting devices electrically connected to the driving transistors. The first circuit 10 transmits a working voltage to one corresponding light-emitting device. The second circuit 20 transmits a data voltage to one corresponding driving transistor. The pixel circuit may be, but is not limited to, a 7T1C circuit. The driving transistors may be the transistors 50 shown in FIG. 4. The light-emitting devices may be the light-emitting portions 40 shown in FIG. 4. Please refer to the above description, it can be seen that each of the transistors 50 is electrically connected to one corresponding anode portion 30. The working voltage of the first circuit 10 and the data voltage of the second circuit 20 can jointly control the voltage of the corresponding anode portion 30. The cathode layer may have a constant voltage. Each of the light-emitting portions 40 emits light through the current generated by the voltage difference between the corresponding anode portion 30 and the cathode layer.

Figure 5:
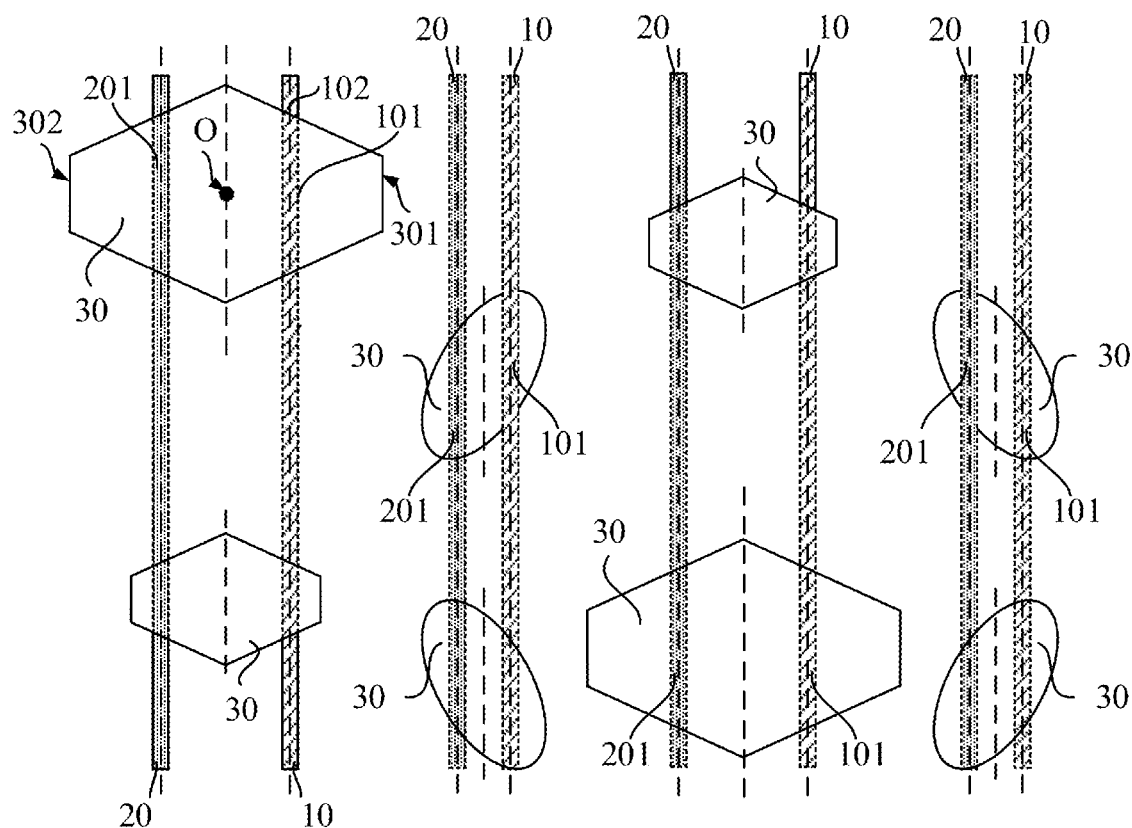
FIG. 5 is a schematic top view of a third type of a display panel according to an embodiment of the present disclosure.

Furthermore, as shown in FIG. 5, a plurality of first circuits 10 as voltage lines and a plurality of second circuits 20 as data lines may be disposed in parallel. The anode portions 30 in a same column may be provided with one corresponding first circuit 10 and one corresponding second circuit 20 on a side away from a light-emitting surface. A direction in which the first circuits 10 and the second circuits 20 extend may be same as a direction in which the anode portions 30 in the same column are disposed. The first circuits 10 and the second circuits 20 may be parallel to each other and disposed alternately. A distance between one first circuit 10 and one adjacent second circuit 20 is related to sizes of the anode portions 30 or a distance between two adjacent anode portions 30. Herein, shapes and sizes of portions of the first circuits 10 and the second circuits 20 that do not overlap with the anode portions 30 are not limited, as long as the first circuits 10 and the second circuits 20 meet the above requirements. Shapes of the anode portions 30 may be same or different. Furthermore, shapes of the anode portions 30 that emit light of a same color may be set to be same.

In an embodiment, as shown in FIG. 1 to FIG. 4, the first circuit portion 101 comprises a first sub-circuit portion located at a first circuit layer 60 and a second sub-circuit portion located at a second circuit layer 70. The second circuit portion 201 is located at the first circuit layer 60 or the second circuit layer 70. The first sub-circuit portion is electrically connected to the second sub-circuit portion. An absolute value of a difference between a width of the first sub-circuit portion and a width of the second sub-circuit portion is less than an absolute value of a difference between the width of the first circuit portion 101 and the width of the second circuit portion 201.

Specifically, as shown in FIG. 4, each of the transistors 50 comprises an active portion, a first gate portion 503 located above the active portion, a second gate portion 504 located above the first gate portion 503, and a source and drain portion located above the second gate portion 524. The source and drain portion comprises a source electrode 505 and a drain electrode 506 disposed at a same layer. The first gate portion 503 and the second gate portion 504 are electrically connected. The active portion comprises a main body part 501 and two doped parts 502 disposed on two opposite sides of the main body part 501. The doped parts 502 may comprise, but are not limited to, nitrogen element or phosphorus element. A first gate insulating portion 507 is disposed between the active portion and the first gate portion 503. A second gate insulating portion 508 is disposed between the first gate portion 503 and the second gate portion 504. A dielectric layer 509 is disposed between the second gate portion 504 and the source and drain portion. The first gate insulating portion 507, the second gate insulating portion 508, and the dielectric layer 509 may all be disposed as a whole layer. The source electrode 505 may be electrically connected to one of the doped parts 502 of one corresponding active portion through a conductive material in a first via hole 5051. The drain electrode 506 may be electrically connected to the other doped part 502 of the corresponding active portion through a conductive material in a second via hole 5061.

Figure 6:
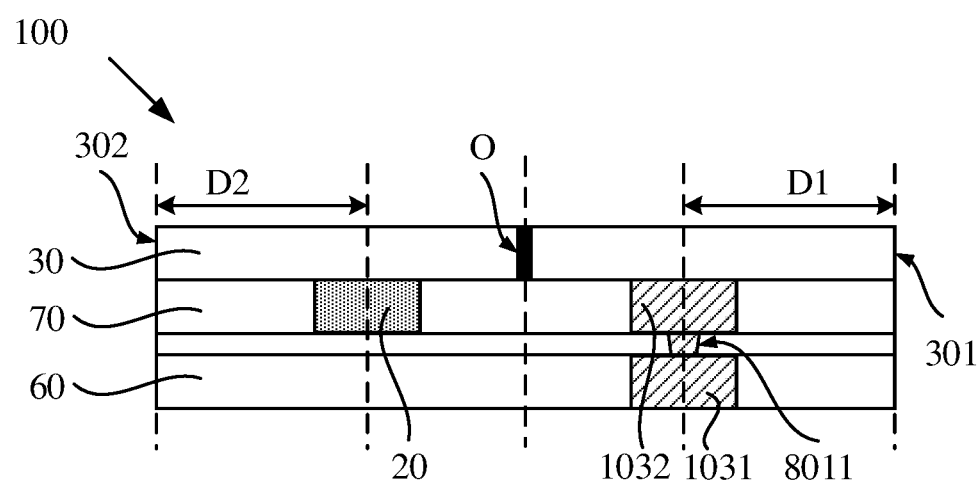
FIG. 6 is a schematic cross-sectional view of the third type of the display panel according to an embodiment of the present disclosure.

As shown in FIG. 4 and FIG. 6, a plurality of the source and drain portions may be disposed at the first circuit layer 60. That is, the first sub-circuit portion may be disposed at a same layer as the source and drain portions. A first planarization layer 801 may be disposed between the second circuit layer 70 and the first circuit layer 60. Furthermore, the second circuit layer 70 comprises a plurality of node portions 702. That is, the second sub-circuit portion is disposed at a same layer as the node portions 702. The node portions 702 may correspond one-to-one to the drain electrodes 506. Each of the node portions 702 is electrically connected to one corresponding drain electrode 506 through a conductive material in a third via hole 7011. The third via hole 7011 may pass through the first planarization layer 801. Moreover, the first sub-circuit portion located at the first circuit layer 60 and the second sub-circuit portion located at the second circuit layer 70 may be electrically connected to each other through a conductive material in a via hole 8011 passing through the first planarization layer 801.

It can be understood that on one hand, in this embodiment, the second circuit 20 is disposed at the first circuit layer 60 or the second circuit layer 70. That is, one of the first circuit layer 60 and the second circuit layer 70 that are provided with the first circuit 10 may be selected to dispose the second circuit 20, so as to avoid disposing the second circuit 20 at another layer to increase a thickness of the display panel 100. This is conducive to lightening and thinning of the display panel 100, and can reduce a thickness difference of convex structures of the anode portion 30 caused by the first circuit 10 and the second circuit 20, thereby reducing the deviation of the light-emitting angle of the corresponding light-emitting portion 40. On the other hand, because the first circuit portion 101 is disposed at two layers, and the second circuit portion 201 is disposed at one layer, there is a risk that a total width of the first circuit portion 101 and the width of the second circuit portion 201 are significantly different. In this embodiment, only the absolute value of the difference between the width of the first circuit portion 101 and the width of the second circuit portion 201 is used as a reference, and the absolute value of the difference between the width of the first sub-circuit portion and the width of the second sub-circuit portion is less than the absolute value of the difference between the width of the first circuit portion 101 and the width of the second circuit portion 201, so as to ensure that a difference between the total width of the first circuit portion 101 and the width of the second circuit portion 201 can still be small. Furthermore, the total width of the first circuit portion 101 may be equal to the width of the second circuit portion 201. Therefore, in this embodiment, the first sub-circuit portion and the second sub-circuit portion may be electrically connected to make the first circuit 10 have a smaller impedance while avoiding increasing the total width of the first circuit portion 101, thereby reducing the deviation of the light-emitting angle of the corresponding light-emitting portion 40, and reducing the asymmetry of the brightness or chromaticity viewing angle of the displayed image.

Furthermore, as shown in FIG. 4, a second planarization layer 802 may cover the node portions 702. A plurality of pixel defining portions 803 may be disposed on the second planarization layer 802. One anode portion 30 and one light-emitting portion 40 on the anode portion 30 may be disposed between two adjacent pixel defining portions 803. An encapsulation layer may be disposed on the light-emitting portions 40 and the pixel defining portions 803. The encapsulation layer may comprise a first inorganic layer 804, an organic layer 805 on the first inorganic layer 804, and a second inorganic layer 806 on the organic layer 805. The first inorganic layer 804 and the second inorganic layer 806 may be made of, but are not limited to, a mixture of silicon nitride and silicon oxide. The substrate 807 is made of, but is not limited to, polyimide.

In an embodiment, as shown in FIG. 2 to FIG. 6, the second circuit layer 70 is disposed between the first circuit layer 60 and the anode portions 30, and the second circuit 20 is located at the second circuit layer 70. It should be noted that, according to the above description, the second circuit 20 transmits a data voltage to the transistor 50. The second circuit 20 may be electrically connected to the source electrode 505 or the drain electrode 506 of the transistor 50. A voltage transmitted by the first gate portion 503 and the second gate portion 504 of the transistor 50 is different from the data voltage transmitted by the second circuit 20. In this embodiment, the second circuit 20 is disposed at the second circuit layer 70 that is farther from the first gate portion 503 and the second gate portion 504, so that a distance between the second circuit 20 and the first gate portion 503 and a distance between the second circuit 20 and the second gate portion 504 are relatively large. This can reduce a parasitic capacitance formed between the second circuit 20 and the first gate portion 503 and a parasitic capacitance formed between the second circuit 20 and the second gate portion 504, thereby reducing interference between different voltages.

In an embodiment, as shown in FIG. 2, FIG. 3, and FIG. 6, a portion of the first circuit 10 protruding beyond the anode portion 30 (for example, the third circuit portion 102) comprises a third sub-circuit portion 1031 located at a third circuit layer and a fourth sub-circuit portion 1032 located at a fourth circuit layer. The third sub-circuit portion 1031 is electrically connected to the fourth sub-circuit portion 1032. The first circuit portion 101 and the second circuit 20 are both located at the third circuit layer or the fourth circuit layer. Specifically, the third circuit layer is the first circuit layer 60 and the fourth circuit layer is the second circuit layer 70 as an example for description herein.

Please refer to FIG. 4, FIG. 6, and the above description, it can be seen that the third sub-circuit portion 1031 located at the first circuit layer 60 and the fourth sub-circuit portion 1032 located at the second circuit layer 70 may also be electrically connected by a conductive material filled in the via hole 8011 in the first planarization layer 801. Specifically, as shown in FIG. 2 to FIG. 4, in this embodiment, the first circuit portion 101 is disposed at the first circuit layer 60 or the second circuit layer 70. That is, the first circuit portion 101 does not occupy the first circuit layer 60 and the second circuit layer 70 at a same time, so that a total thickness of the first circuit portion 101 can be smaller. It is understandable that on the basis that the second circuit 20 is disposed at the first circuit layer 60 or the second circuit layer 70, in this embodiment, the first circuit portion 101 and the second circuit 20 are disposed at a same layer, which can avoid a large thickness difference of the convex structures of the anode portion 30 caused by the first circuit 10 and the second circuit 20, so that flatness of two parts of the anode portion 30 corresponding to the first circuit portion 101 and the second circuit portion 201 tends to be same. This reduces the deviation of the light-emitting angle of the corresponding light-emitting portion 40, and reduces the asymmetry of the brightness or chromaticity viewing angle of the displayed image.

Specifically, the first circuit 10 transmits a working voltage to the light-emitting device, and the second circuit 20 transmits a data voltage to the driving transistor. The third circuit layer is the first circuit layer 60, and the fourth circuit layer is the second circuit layer 70. The second circuit layer 70 is disposed between the first circuit layer 60 and the anode portion 30. Accordingly, the first circuit portion 101 and the second circuit 20 may be disposed at the same fourth circuit layer. According to the above description, in this embodiment, the asymmetry of the brightness or chromaticity viewing angle of the displayed image can be reduced, and the parasitic capacitance formed between the second circuit 20 and the first gate portion 503 and the parasitic capacitance formed between the second circuit 20 and the second gate portion 504 can also be reduced, thereby reducing the interference between the different voltages The present disclosure further provides a mobile terminal. The mobile terminal comprises a terminal body and any display panel as described above. The terminal body is integrated with the display panel.

The present disclosure provides a display panel and a mobile terminal. The display panel comprises a substrate, an anode portion disposed on the substrate, and a first circuit and a second circuit disposed between the anode portion and the substrate. The first circuit is disposed close to a first edge of the anode portion. The second circuit is disposed close to a second edge of the anode portion. The first circuit comprises a first circuit portion disposed corresponding to the anode portion. The second circuit comprises a second circuit portion disposed corresponding to the anode portion. The first circuit portion and the second circuit portion are disposed on opposite sides of a center of the anode portion. A distance between the first circuit portion and the first edge is a first distance. A distance between the second circuit portion and the second edge is a second distance. An absolute value of a difference between the first distance and the second distance is less than a width of the first circuit portion or a width of the second circuit portion. In the present disclosure, the difference between the first distance and the second distance is set to be sufficiently small. That is, a distance between a convex structure of the anode portion caused by the first circuit and one corresponding edge is equivalent to distance between another convex structure of the anode portion caused by the second circuit and one corresponding edge, which improves symmetry of the two convex structures of the anode portion, thereby reducing deviation of a light-emitting angle of a light emitted by a light-emitting device. Therefore, a degree of asymmetry of a brightness or chromaticity viewing angle of the display panel is reduced, thereby improving display quality.

The display panel and the mobile terminal provided by the embodiments of the present disclosure are described in detail above. The present disclosure uses specific examples to describe principles and embodiments of the present application. The above description of the embodiments is only for helping to understand the technical solutions of the present disclosure and its core ideas. It should be understood by those skilled in the art that they can modify the technical solutions recited in the foregoing embodiments, or replace some of technical features in the foregoing embodiments with equivalents. These modifications or replacements do not cause essence of corresponding technical solutions to depart from the scope of the technical solutions of the embodiments of the present disclosure.

What is claimed is:

1. A display panel, comprising:
a substrate;
a plurality of anode portions disposed on the substrate; and for each of the anode portions, a first circuit and a second circuit disposed between the anode portion and the substrate, wherein the first circuit is disposed close to a first edge of the anode portion, the second circuit is disposed close to a second edge of the anode portion, the first circuit comprises a first circuit portion disposed corresponding to the anode portion, the second circuit comprises a second circuit portion disposed corresponding to the anode portion, the first circuit portion and the second circuit portion are disposed on opposite sides of a center of the anode portion, a distance between the first circuit portion and the first edge is a first distance, a distance between the second circuit portion and the second edge is a second distance, an absolute value of a difference between the first distance and the second distance is less than a width of the first circuit portion or a width of the second circuit portion, a distance between the first circuit portion and the center of the anode portion is a third distance, a distance between the second circuit portion and the center of the anode portion is a fourth distance, and an absolute value of a difference between the third distance and the fourth distance is less than the width of the first circuit portion or the width of the second circuit portion; and wherein the first circuit further comprises a third circuit portion protruding beyond the anode portion, and the width of the first circuit portion and the width of the second circuit portion are less than a width of the third circuit portion, wherein the third circuit portion comprises a third sub-circuit portion located at a third circuit layer and a fourth sub-circuit portion located at a fourth circuit layer, the third sub-circuit portion is electrically connected to the fourth sub-circuit portion, and the first circuit portion and the second circuit are both located at the third circuit layer or the fourth circuit layer, wherein the first circuit transmits a working voltage to a light-emitting device, and the second circuit transmits a data voltage to a driving transistor, wherein a plurality of first circuits as voltage lines and a plurality of second circuits as data lines are disposed in parallel, anode portions in a same column are provided with one corresponding first circuit and one corresponding second circuit on a side away from the light-emitting surface, a direction in which the first circuits and the second circuits extend is same as a direction in which the anode portions in the same column are disposed, wherein two circuit portions are disposed axisymmetrically with respect to a centerline of the anode portion corresponding to a pixel, the two circuit portions being the first circuit portion and second circuit portion, the first circuit portion comprises a first sub-circuit portion located at a first circuit layer and a second sub-circuit portion located at a second circuit layer, the second circuit portion is located at the first circuit layer or the second circuit layer, the first sub-circuit portion is electrically connected to the second sub-circuit portion, and an absolute value of a difference between a width of the first sub-circuit portion and a width of the second sub-circuit portion is less than an absolute value of a difference between the width of the first circuit portion and the width of the second circuit portion.

2. The display panel according to claim 1, wherein an absolute value of a difference between the width of the first circuit portion and the width of the second circuit portion is less than an absolute value of a difference between the width of the third circuit portion and the width of the second circuit portion.

3. The display panel according to claim 1, wherein the centerline passes through the center of the anode portion, the anode portion is axisymmetric, and the centerline is an axis of symmetry of the anode portion.

4. The display panel according to claim 1, further comprising a pixel circuit that comprises the driving transistor and the light-emitting device electrically connected to the driving transistor.

5. The display panel according to claim 1, wherein the driving transistor comprises an active portion, a first gate portion located above the active portion, a second gate portion located above the first gate portion, and a source and drain portion located above the second gate portion and at the first circuit layer.

6. The display panel according to claim 1, wherein the second circuit layer is disposed between the first circuit layer and the anode portion, and the second circuit is located at the second circuit layer.

7. A display panel, comprising:
a substrate;
a plurality of anode portions disposed on the substrate; and
for each of the anode portions, a first circuit and a second circuit disposed between the anode portion and the substrate, wherein the first circuit is disposed close to a first edge of the anode portion, the second circuit is disposed close to a second edge of the anode portion, the first circuit comprises a first circuit portion disposed corresponding to the anode portion, the second circuit comprises a second circuit portion disposed corresponding to the anode portion, the first circuit portion and the second circuit portion are disposed on opposite sides of a center of the anode portion, a distance between the first circuit portion and the first edge is a first distance, a distance between the second circuit portion and the second edge is a second distance, and an absolute value of a difference between the first distance and the second distance is less than a width of the first circuit portion or a width of the second circuit portion,
wherein a portion of the first circuit protruding beyond the anode portion comprises a third sub-circuit portion located at a third circuit layer and a fourth sub-circuit portion located at a fourth circuit layer, the third sub-circuit portion is electrically connected to the fourth sub-circuit portion, and the first circuit portion and the second circuit are both located at the third circuit layer or the fourth circuit layer,
wherein the first circuit transmits a working voltage to a light-emitting device, and the second circuit transmits a data voltage to a driving transistor,
wherein a plurality of first circuits as voltage lines and a plurality of second circuits as data lines are disposed in parallel, anode portions in a same column are provided with one corresponding first circuit and one corresponding second circuit on a side away from the light-emitting surface, a direction in which the first circuits and the second circuits extend is same as a direction in which the anode portions in the same column are disposed,
wherein two circuit portions are disposed axisymmetrically with respect to a centerline of the anode portion corresponding to a pixel, the two circuit portions being the first circuit portion and second circuit portion, the first circuit portion comprises a first sub-circuit portion located at a first circuit layer and a second sub-circuit portion located at a second circuit layer, the second circuit portion is located at the first circuit layer or the second circuit layer, the first sub-circuit portion is electrically connected to the second sub-circuit portion, and an absolute value of a difference between a width of the first sub-circuit portion and a width of the second sub-circuit portion is less than an absolute value of a difference between the width of the first circuit portion and the width of the second circuit portion.

8. The display panel according to claim 7, wherein the first circuit further comprises a third circuit portion protruding beyond the anode portion, and the width of the first circuit portion and the width of the second circuit portion are less than a width of the third circuit portion.

9. The display panel according to claim 8, wherein an absolute value of a difference between the width of the first circuit portion and the width of the second circuit portion is less than an absolute value of a difference between the width of the third circuit portion and the width of the second circuit portion.

10. The display panel according to claim 7, wherein a distance between the first circuit portion and the center of the anode portion is a third distance, a distance between the second circuit portion and the center of the anode portion is a fourth distance, and an absolute value of a difference between the third distance and the fourth distance is less than the width of the first circuit portion or the width of the second circuit portion.

11. The display panel according to claim 7, wherein the centerline passes through the center of the anode portion, the anode portion is axisymmetric, and the centerline is an axis of symmetry of the anode portion.

12. The display panel according to claim 7, further comprising a pixel circuit that comprises the driving transistor and the light-emitting device electrically connected to the driving transistor.

13. The display panel according to claim 7, wherein the driving transistor comprises an active portion, a first gate portion located above the active portion, a second gate portion located above the first gate portion, and a source and drain portion located above the second gate portion and at the first circuit layer.

14. The display panel according to claim 13, further comprising a first planarization layer disposed between the second circuit layer and the first circuit layer, wherein the source and drain portion comprises a source electrode and a drain electrode disposed at a same layer, the second circuit layer comprises a node portion corresponding to the drain electrode, the node portion is electrically connected to the drain electrode through a via hole passing through the first planarization layer, and the first sub-circuit portion located at the first circuit layer and the second sub-circuit portion located at the second circuit layer are electrically connected to each other through another via hole passing through the first planarization layer.

15. The display panel according to claim 7, wherein the second circuit layer is disposed between the first circuit layer and the anode portion, and the second circuit is located at the second circuit layer.

16. A mobile terminal, comprising a terminal body and a display panel integrated with the terminal body, wherein the display panel comprises:
a substrate;
a plurality of anode portions disposed on the substrate; and for each of the anode portions, a first circuit and a second circuit disposed between the anode portion and the substrate, wherein the first circuit is disposed close to a first edge of the anode portion, the second circuit is disposed close to a second edge of the anode portion, the first circuit comprises a first circuit portion disposed corresponding to the anode portion, the second circuit comprises a second circuit portion disposed corresponding to the anode portion, the first circuit portion and the second circuit portion are disposed on opposite sides of a center of the anode portion, a distance between the first circuit portion and the first edge is a first distance, a distance between the second circuit portion and the second edge is a second distance, and an absolute value of a difference between the first distance and the second distance is less than a width of the first circuit portion or a width of the second circuit portion, wherein a portion of the first circuit protruding beyond the anode portion comprises a third sub-circuit portion located at a third circuit layer and a fourth sub-circuit portion located at a fourth circuit layer, the third sub-circuit portion is electrically connected to the fourth sub-circuit portion, and the first circuit portion and the second circuit are both located at the third circuit layer or the fourth circuit layer, wherein the first circuit transmits a working voltage to a light-emitting device, and the second circuit transmits a data voltage to a driving transistor, wherein a plurality of first circuits as voltage lines and a plurality of second circuits as data lines are disposed in parallel, anode portions in a same column are provided with one corresponding first circuit and one corresponding second circuit on a side away from the light-emitting surface, a direction in which the first circuits and the second circuits extend is same as a direction in which the anode portions in the same column are disposed, wherein two circuit portions are disposed axisymmetrically with respect to a centerline of the anode portion corresponding to a pixel, the two circuit portions being the first circuit portion and second circuit portion, the first circuit portion comprises a first sub-circuit portion located at a first circuit layer and a second sub-circuit portion located at a second circuit layer, the second circuit portion is located at the first circuit layer or the second circuit layer, the first sub-circuit portion is electrically connected to the second sub-circuit portion, and an absolute value of a difference between a width of the first sub-circuit portion and a width of the second sub-circuit portion is less than an absolute value of a difference between the width of the first circuit portion and the width of the second circuit portion.

* * * * *